(12) United States Patent
Biggs et al.

(10) Patent No.: US 7,665,399 B2  
(45) Date of Patent: Feb. 23, 2010

(54) SYSTEM AND METHOD FOR VACUUM GENERATED IMPRINTING

(75) Inventors: Todd L. Biggs, Queen Creek, AZ (US); Jeff R. Wienrich, Gilbert, AZ (US)

(73) Assignee: INTEL Corporation, Santa Clara, CA (US)

( * ) Notice: Subject to any disclaimer, the term of this patent is extended or adjusted under 35 U.S.C. 154(b) by 0 days.

(21) Appl. No.: 12/116,134

(22) Filed: May 6, 2008

(65) Prior Publication Data

US 2008/0202363 A1  Aug. 28, 2008

Related U.S. Application Data

(62) Division of application No. 11/068,083, filed on Feb. 24, 2005, now Pat. No. 7,383,769.

(51) Int. Cl.  
*B31F 1/07* (2006.01)

(52) U.S. Cl. .............................. 101/28; 101/32; 101/485

(58) Field of Classification Search .................. 101/3.1, 101/28, 31.1, 32, 41, 327, 114, 483, 485; 257/678, 684  
See application file for complete search history.

(56) References Cited

U.S. PATENT DOCUMENTS

| | | |
|---|---|---|
| 3,369,919 A | 2/1968 | Inglis |
| 3,372,638 A | 3/1968 | Tripp |
| 3,478,680 A | 11/1969 | Anderson, Jr. |
| 4,622,239 A | 11/1986 | Schoenthaler et al. |
| 5,669,303 A | 9/1997 | Maracas et al. |
| 6,829,988 B2 | 12/2004 | George et al. |

OTHER PUBLICATIONS

Merriam-Webster, Online Dictionary, definition of piston, Sep. 26, 2007 (www.m-w.com/dictionary/piston).

*Primary Examiner*—Ren Yan  
(74) *Attorney, Agent, or Firm*—Marger, Johnson & McCollom, P.C.

(57) ABSTRACT

A system to imprint patterns on impressionable materials by generating a pressure differential within an imprinting chamber by creating a substantial vacuum in an imprinting area is provided. This system can be used to create conductive traces in a substrate onto which integrated circuit chips and dies can be mounted to create semiconductor packages. A low pressure line evacuates air from a material receiving area of a vessel creating a pressure differential across pistons in the vessel to thereby causing the pistons to press microtools into impressionable material layers. The low pressure line helps the microtools conform to any thickness variations in the imprinted material and prevents air pockets from developing between the microtool and the imprinted material.

17 Claims, 7 Drawing Sheets

SYSTEM AND METHOD FOR VACUUM GENERATED IMPRINTING

CROSS REFERENCE TO RELATED APPLICATIONS

This application is a divisional of and claims priority to U.S. patent Ser. No. 11/068,083 now U.S. Pat. No. 7,383,769, filed Feb. 24, 2005 issued Jun. 10, 2008, the specification of which is incorporated herein in its entirety.

TECHNICAL FIELD

This disclosure relates to substrates on which semiconductor chips and dies can be mounted and, more specifically, to a system and method for creating connection patterns in such substrates using vacuum generated imprinting.

BACKGROUND

Semiconductor integrated circuit chips and dies are relatively fragile. To protect chips and dies from damage, they are typically confined in a semiconductor package. For example, Ball Grid Array (BGA) packages typically include at least one integrated circuit chip or die mounted and electrically connected to a substrate with conductive trace lines in the substrate connecting the chip or die to electrical contacts on the bottom surface of the substrate. The chip and the substrate are then encapsulated with resin to protect the chip while leaving the electrical contacts on the bottom surface of the substrate exposed.

Substrates used in semiconductor packages can be made from various materials, typically insulators, including ceramic, plastic, and organic, for instance. Electrical trace lines are integrated into or onto the substrate to provide proper power and signals paths for the chip. One way to form electrical traces is illustrated in FIG. 1.

In FIG. 1, an imprinting system 10 is illustrated. The system 10 includes upper and lower platens 12 and 14 that provide pressure for upper and lower rigid microtools 22 and 24, respectively. The microtools 22 and 24 each include several embossings 25 that project from a base of the corresponding microtool. A substrate 30 is covered on two surfaces by impressionable material layers 32 and 34, which can be made of uncured thermal-setting epoxy. As illustrated in FIG. 2, in operation, the microtools 22 and 24 are each pressed by the platens 12 and 14 into the impressionable material layers 32 and 34. Embossings 25 on the microtools 22 and 24 leave impressions in the material layers 32 and 34. The material layers 32 and 34 are then cured. After the microtools 22 and 24 are removed, the impressions remain in the material layers 32 and 34.

The impressions are later filled with an electrically conductive material, such as copper or gold metal, and machined or otherwise processed to provide the electrical traces in the substrate.

After a first set of material layers 32 and 34 is imprinted and the electrical traces created in the layer, another set of material layers of impressionable material (not shown) can be deposited over the first and the cycle can be repeated, resulting in a multi-layer substrate.

Although the platens 12 and 14 are typically compliant or otherwise float to match imperfections of the substrate 30 and the impressionable material layers 32 and 34, the microtools 22 and 24 shown in FIGS. 1 and 2 are relatively rigid. With reference to FIG. 2, when the microtools 22 and 24 are pressed into the impressionable material layers 32 and 34, the embossings 25 do not always imprint to a consistent depth. Because of the imperfections in the substrate 30 and impressionable material layers 32 and 34, known as Total Thickness Variation (TTV), some of the impressions left in the material layers 32 and 34 after the microtools 22 and 24 are removed are relatively shallow or non-existent, while other impressions are relatively deep. This variation in impression depth can cause problems when the impressions are later filled with the conductive material machined to make the electrical traces in the substrate.

During processing of the impressions, the conductive material filling some of the more shallow impressions can be completely or mostly removed, either of which will cause inferior or inoperative electrical connections with the chip or die to be mounted on the substrate.

Another problem with the imprinting process as described is that air or other gasses can be trapped in the material layers 32 and 34, depending on the sequence of events, due to out-gassing of the imprint materials and air pockets formed between the microtools 22, 24 and the material layers 32 and 34.

A soft tooling pressing system is illustrated in FIGS. 3-5. In FIG. 3, a system 40 includes an upper heater 42, lower heater 52, an upper microtool 44 and a lower microtool 54. Differently from the above embodiment, the microtools 44 and 54 are soft tools and have a degree of flexibility and conformity. Soft tool microtools have the ability to conform to variations in the thickness of the impressionable layers. Soft tool microtools can be made from nickel which is relatively flexible. The views of the flexing of the soft microtools 44 and 54 in FIGS. 3-5 are exaggerated for illustration purposes. The substrate 60 can be covered by impressionable materials on both sides.

In a first operation, illustrated in FIG. 4, the microtools 44 and 54 are held in place by a vacuum generated to pull the microtools toward the heaters 42 and 52. As illustrated in FIG. 3, this vacuum action causes a deformation in the soft microtools 44 and 54. Such vacuum action also creates air pockets 70 (shown in FIG. 5) between the microtools 44 and 54 and the substrate 60.

In a next step, imprint pressure is applied to the backsides of the microtools 44 and 54, as illustrated in FIG. 5. As the imprint pressure is applied, the air pockets 70 are partially dissipated, but some of the air from the pockets 70 is forced into the impressionable material on the substrate 60. Other portions are not forced into the material but instead create fluid back pressure that presses on the front sides of the microtools 44 and 54, which can prevent the imprint regions of the microtools from fully pressing into the impressionable material. As described above, this causes connection problems when the impressions are filled and processed into electrical connection lines.

Additionally, because edges of the microtools are clamped in position during the impression period, boundary conditions exist around the microtools 44 and 54 that prevent the tools from ever being able to possibly be perfectly flat and that may adversely affect the impression depth and uniformity.

Embodiments of the invention address these and other disadvantages in the prior art.

BRIEF DESCRIPTION OF THE DRAWINGS

The description may be best understood by reading the disclosure with reference to the accompanying drawings.

DETAILED DESCRIPTION

Figure 1:
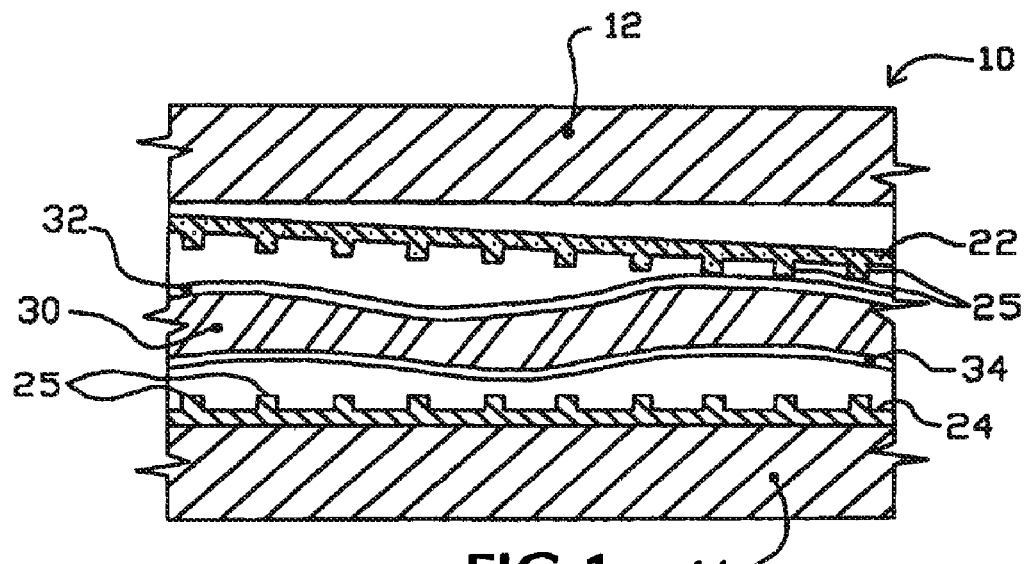
FIGS. 1 and 2 are cross-sectional views of a substrate impression system.
Figure 2:
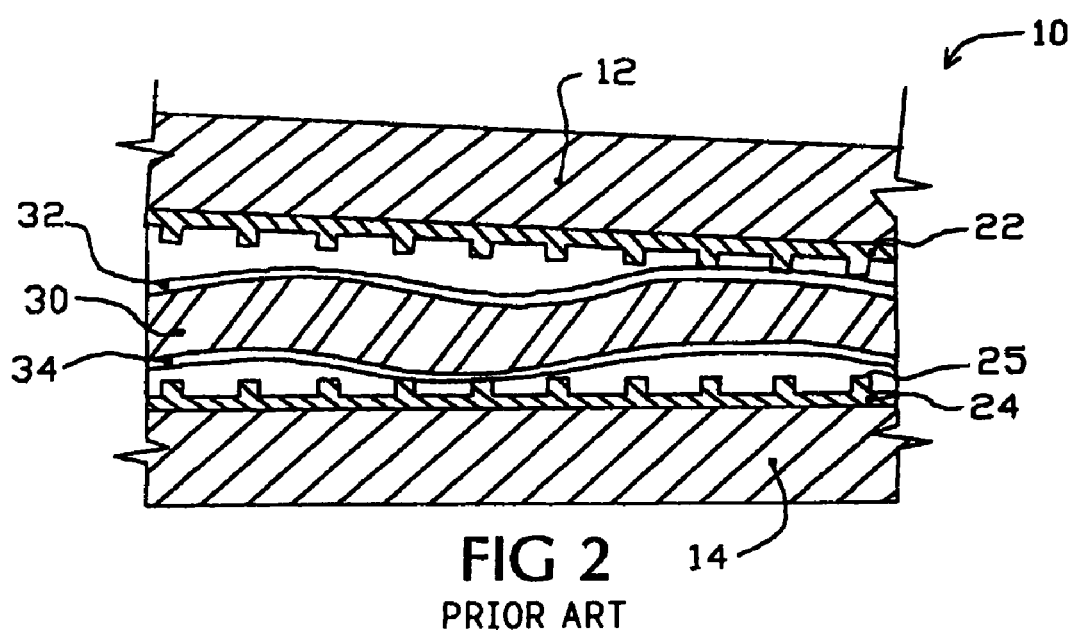
Figure 3:
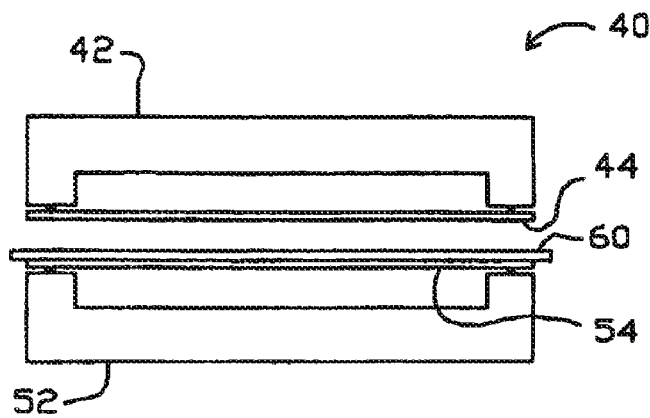
FIGS. 3-5 are cross-sectional views of another substrate impression system.
Figure 4:
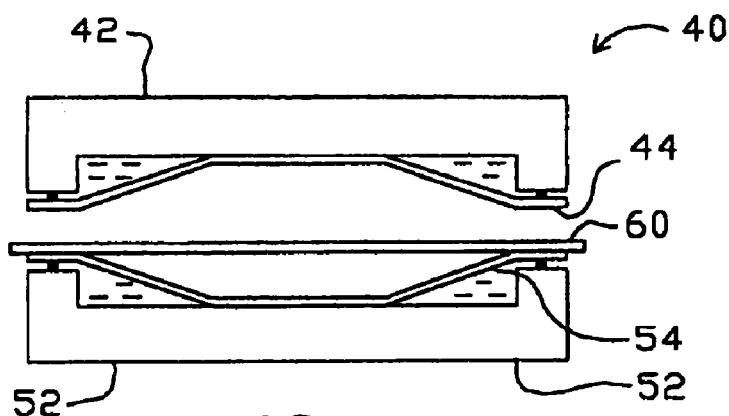
Figure 5:
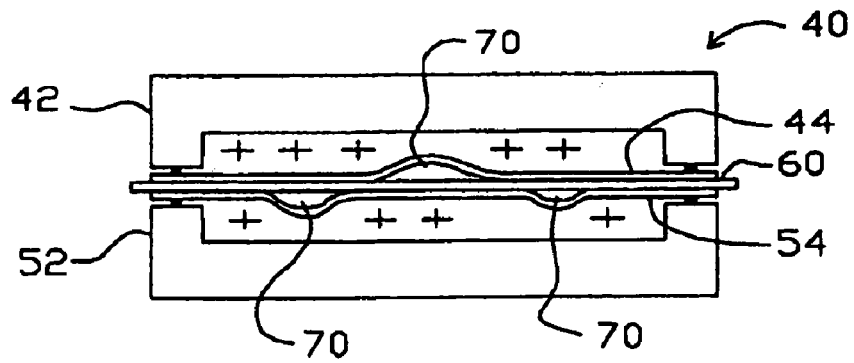
Figure 6:
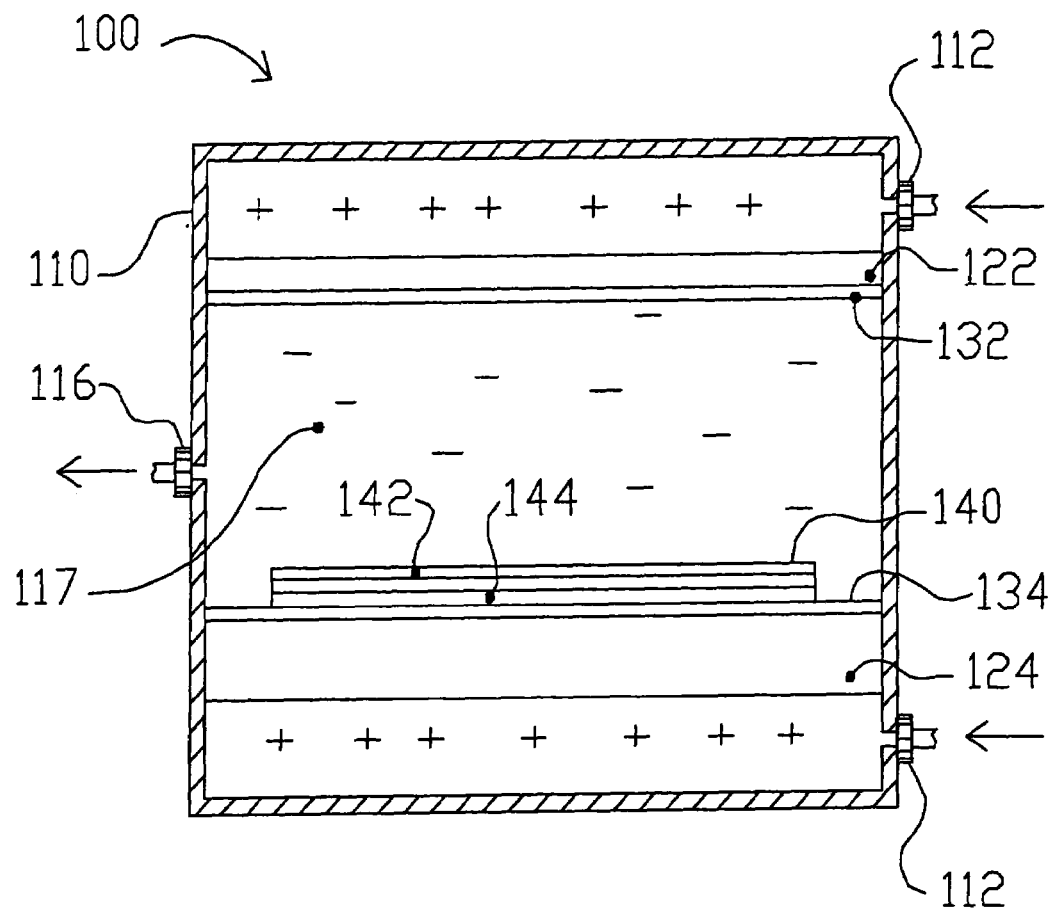
FIG. 6 is a cross-sectional diagram of an inventive material imprinting system according to an embodiment.

FIG. 6 is a cross-sectional diagram illustrating an inventive material imprinting system 100 according to an embodiment of the invention. The system 100 includes a chamber vessel 110 formed of a material such as steel that is strong enough to support various pressures and vacuums that will be generated within the vessel.

Two or more vent/pressure lines 112 extend through walls of the vessel 110 and at least one low pressure (vacuum) line 116 also extends through the walls of the vessel 110.

In the illustrated embodiment, the vent/pressure lines 112 are located near the ends of the vessel 110, while the vacuum line 116 is located near the center of the vessel adjacent to the material receiving area 117.

An upper piston 122 and a lower piston 124 travel within the vessel based on a pressure differential in the vessel, as described below. Adjacent to the pistons 122 and 124 are microtools 132 and 134, which can be similar to those described above, each having embossings in imprint regions (not illustrated in FIG. 6) on a face opposite the pistons 122 and, 124.

Figure 7:
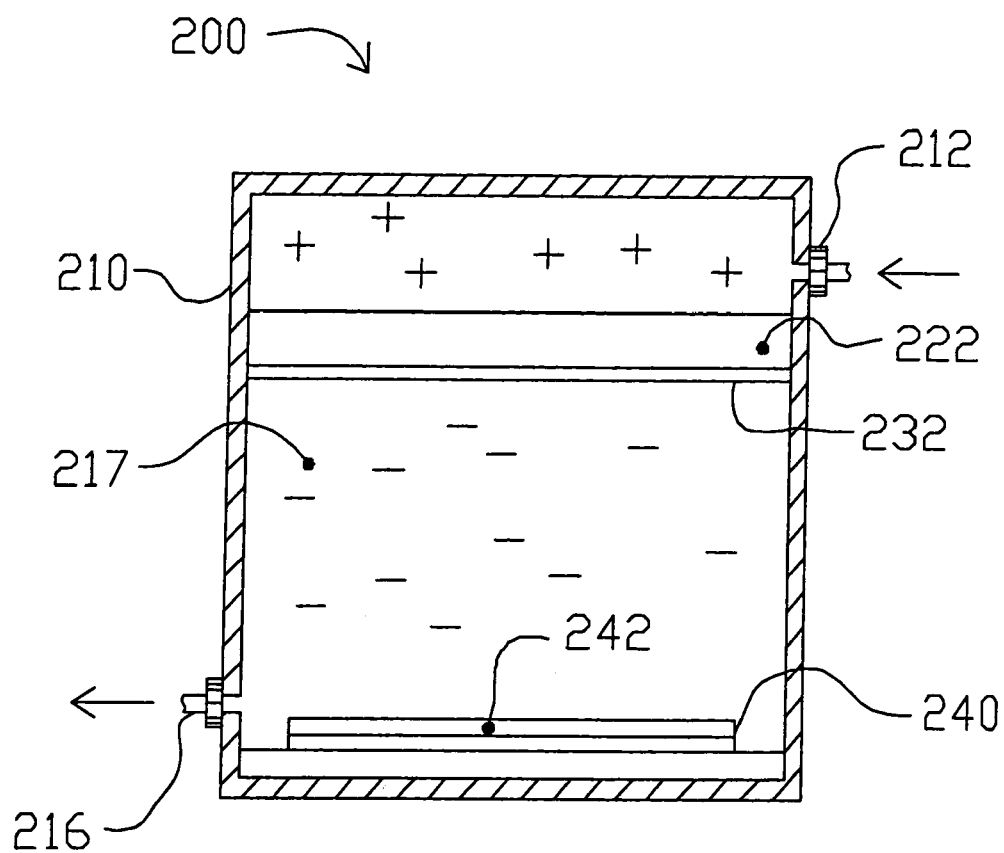
FIG. 7 is a cross-sectional diagram of an inventive material imprinting system according to another embodiment.

A substrate 140 is positioned in the material receiving area 117. The substrate 140 includes impressionable material layers 142 and 144 on opposing sides, but not all embodiments require two-sided substrates. Embodiments of the invention are equally applicable to substrates 140 having a single impressionable material layer as shown in FIG. 7.

As described below, the microtools 132 and 134 may be made of soft tooling that can conform around TTV variations in the material layers 142 and 144, or the microtools may be made out of relatively stiff materials.

The pistons 122 and 124 may be made of traditional rigid materials, or may be relatively soft. In some embodiments the pistons 122 and 124 may be formed of a bladder or highly elastic fixed membrane such as rubber or some other flexible polymer that can deform and apply pressure to the microtools 132 and 134. The pistons 122 and 124, or seals around the pistons (not shown) may be sealed air tight to the inside surface of the vessel 110, to ensure adequate vessel pressure.

The vessel 110 may also include a sealed door (not shown) to access the material receiving area 117 for inserting and removing the substrate 140.

FIG. 7 is a cross-sectional diagram illustrating a material imprinting system 200. The system 200 includes a chamber vessel 210 formed of material strong enough to support various pressures and vacuums that will be generated within the vessel. At least one vent/pressure line 212 extends through the walls of the vessel 210 and at least one low pressure (vacuum) line 216 extends through the wall of the vessel 210.

In FIG. 7, a substrate 240 is positioned in the material receiving area 217. The substrate 240 has an impressionable material layer 242 on one side facing the upper piston 222. The upper piston 222 travels vertically responsive to a pressure differential within the vessel 210.

Adjacent to the piston 222 is microtool 232, which can be similar to those described in FIG. 6. The microtool 232 has an imprint region (not illustrated in FIG. 7) on a face opposite the piston 222.

Figure 8:
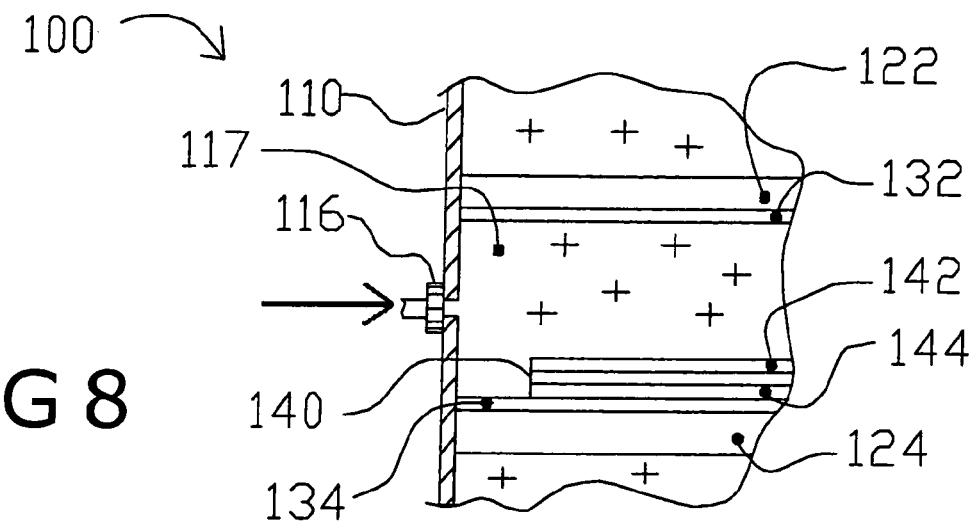
FIGS. 8-10 are cross-sectional diagrams illustrating an imprinting process performed by the imprinting system of FIG. 6.

Referring to the operation of the imprinting system 100 of FIG. 6 as illustrated in FIG. 8, the vessel 110 is filled with a gas such as ambient air or an inert gas. Gas pressures within the vessel 110 can be controlled through the vent/pressure lines 112 and the low pressure line 116 to cause pressure differentials on either side of the pistons 122 and 124.

Figure 9:
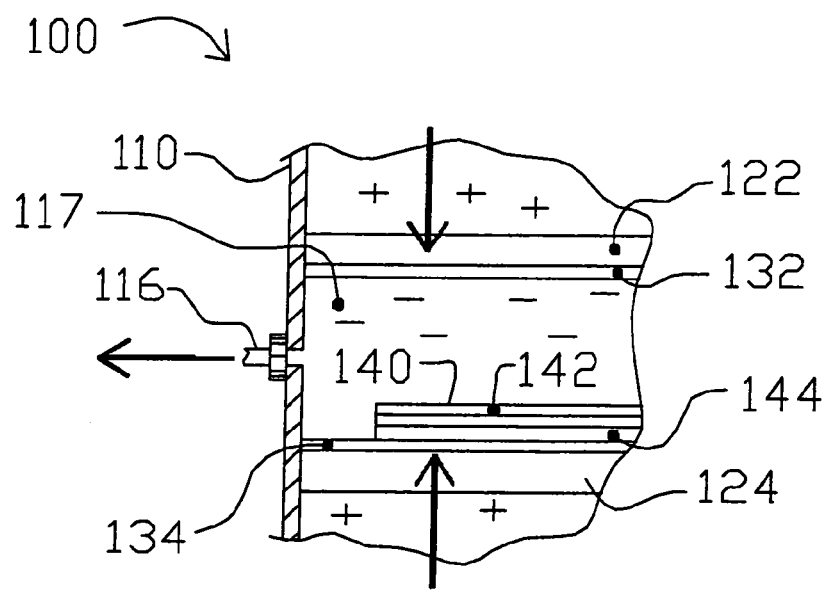
Figure 10:
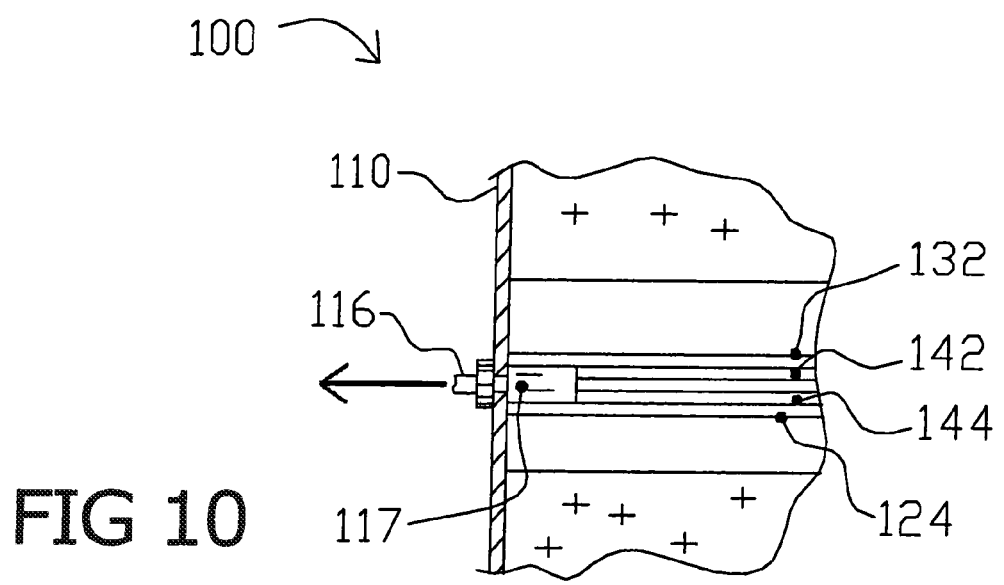

FIG. 9 shows the pressure being reduced near the center of the vessel, i.e., in the material receiving area 117. The low pressure vacuum line 116 evacuates air and other gasses out of the receiving area 117 reducing the pressure in the receiving area to substantially create a vacuum pressure. The pressure differential forces the pistons 122, 124 toward the center of the vessel.

In one embodiment, the vent/pressure lines 112 vent the regions 113 to atmospheric pressure and the pressure differential is created by the low pressure vacuum line 116 reducing the pressure in the material receiving area 117. In another embodiment, the vent/pressure lines 112 supply positive pressure to the regions 113 thereby increasing the pressure differential and thereby increasing the pressure of the microtools 132 and 134 on the impressionable material layers 142 and 144.

As shown in FIG. 9, when the pressure differential increases, the pistons 122 and 124 deform and move to press the microtools 132 and 134 into the impressionable material layers 142 and 144.

When pressure is reduced in the material receiving area 117, gas from this central region is being voided from the vessel 110. Thus, gas within the vessel 110 is removed in the area where the impression is being made. This gas removal has a dual benefit of preventing air or other gas from being forced into the impressionable material layers 142 and 144, while also preventing any gas pockets from forming that may prevent the microtools 132 and 134 from fully impressing into the impressionable material layers 142 and 144.

Once the microtools 132 and 134 reach an adequate pressure against the impressionable material layers 142 and 144, a heater (not shown) heats the impressionable material layers 142 and 144 curing and thereby imprinting patterns of the microtools 132 and 134 in the layers 142 and 144.

A similar process would apply to the system 200 illustrated in FIG. 7 with the single piston 222 applying pressure to the microtool 232 to imprint the single impressionable layer 242.

Figure 11:
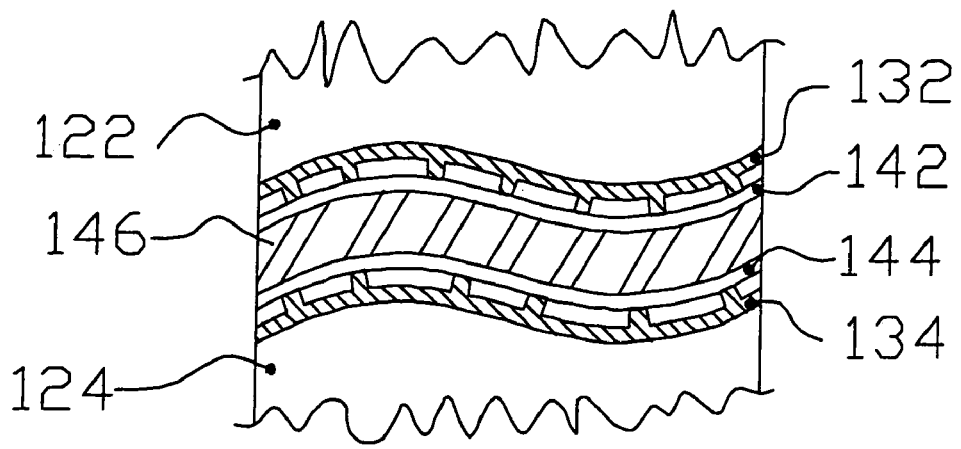
FIG. 11 is a detailed cross-sectional view of the material imprinting system of FIG. 6 showing soft microtools.

As illustrated in FIG. 11, the pistons 122 and 124 can be made from a somewhat pliable material such as rubber or some other flexible polymer. Because the microtools 132 and 134 may also be formed from pliable materials, the microtools 132, 134 can flex and conform to the surface of the substrate 140 and impressionable material layers 142 and 144. Thus, by using such a system, uniform impressions across the entire substrate 140 are made by the microtools 132 and 134.

The pistons 122 and 124 may be made from any material that can generate the force within the vessel 110 to press the microtools 132 and 134 into the impressionable material layers 142 and 144. Preferably, the pistons 122 and 124 are soft enough to conform (or partially conform) to the microtools 132 and 134, yet hard enough to provide adequate pressure to make a good impression. A hardened rubber or gas-filled bladder can provide pliable conformance and adequate pressure.

Figure 12:
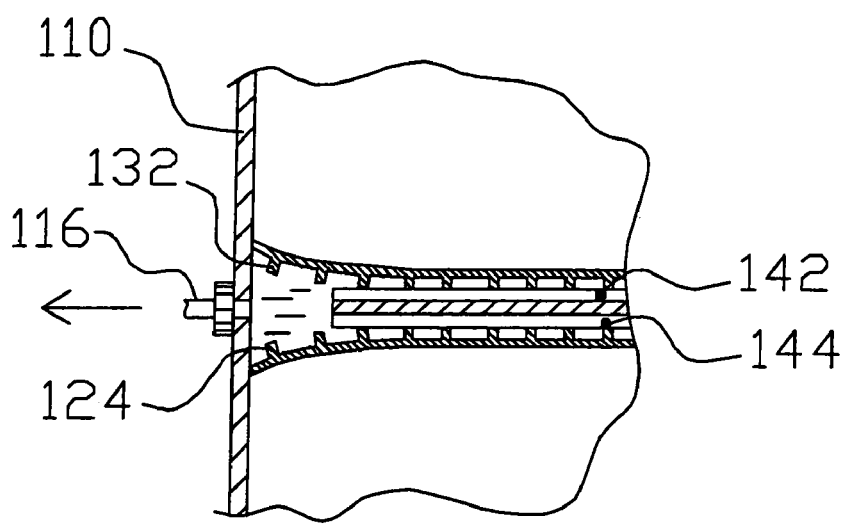
FIG. 12 is a detailed cross-sectional view of the material imprinting system of FIG. 6 showing dished microtools.

In a particular embodiment illustrated in FIG. 12, the microtools 132 and 134 are somewhat dished such that a central portion of the microtool touches its respective impressionable material layer before the outer regions do. In such an embodiment, gasses that may otherwise be trapped can be extracted by the vacuum line 116. In other words, as the central portion of the microtool 132 touches the central portion of the impressionable material layer 142, gasses are being extracted by the vacuum line. By having the outer edges of the microtool 132 touch the material layer 142 last, gasses from inside the vessel 110 would avoid being trapped between the microtool 132 and the material layer 142. FIG. 12 shows two microtools 132, 134, however, a single dished microtool could also be used in an embodiment similar to the imprinting system 200 shown in FIG. 7.

Further, in FIG. 12 only one vacuum line 116 is illustrated, but many such vacuum lines 116 could be placed around the perimeter of the vessel 110 to extract undesirable gasses during production. An additional benefit to including the vacuum lines 116 near the impressionable material layers 142 and 144 is that any outgassing from the layers can be removed by the vacuum line 116.

Actual pressures to be used within the vessel 110 would depend on the types materials used for the impressionable material layer and for the pistons 122 and 124. In one embodiment, the imprint pressure of the microtools 132 and 134 on the material layers 142, 144 need only be about 29 psi to achieve adequate impressions in the material layers 142, 144.

The preceding embodiments are exemplary. Those of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

Although the specification may refer to "an", "one", "another", or "some" embodiment(s) in several locations, this does not necessarily mean that each such reference is to the same embodiment(s), or that the feature only applies to a single embodiment.

We claim the following:

1. A material imprinting system, comprising:
   a top imprinting microtool;
   a bottom imprinting microtool;
   a vacuum outlet to reduce pressure in an area between a material to be imprinted and the imprinting microtools, the reduced pressure causing the microtools to imprint the material; and
   an imprinting chamber housing the imprinting microtools, the imprinting chamber including a top floating piston positioned on a side of the top imprinting microtool opposite the material to be imprinted, the entire top imprinting microtool structured to slide within the imprinting chamber coincident with the top floating piston.

2. The system of claim 1 where the material to be imprinted is a substrate to mount integrated circuit chips and dies in a semiconductor package.

3. The system of claim 2 where the imprinting microtools include embossings to define paths of electrical traces and holes.

4. The system of claim 1 where the imprinting microtool is adapted to imprint a single surface of the material.

5. The system of claim 1 where the top and bottom microtools are soft tools.

6. The system of claim 1 where the top and bottom microtools are hard tools.

7. The system of claim 1 where the reduced pressure is substantially a vacuum pressure.

8. The system of claim 1 where the top floating piston is a highly elastic fixed bladder.

9. The system of claim 1 where the top floating piston is a membrane.

10. The system of claim 1 where the top imprinting microtool is positioned to imprint a top surface of the material; and where the bottom imprinting microtool is positioned to imprint a bottom surface of the material.

11. The system of claim 1 where the imprinting chamber housing further includes:
    a bottom floating piston positioned on a side of the bottom imprinting microtool opposite the material to be imprinted, the entire bottom imprinting microtool structured to slide within the imprinting chamber coincident with the bottom floating piston.

12. A method of imprinting a material, comprising:
    positioning a material in a material receiving area between a top imprinting microtool and a bottom imprinting microtool, the imprinting microtools housed in an imprinting chamber, the imprinting chamber including a top floating piston positioned on a side of the top imprinting microtool opposite the material and a bottom floating piston positioned on a side of the bottom imprinting microtool opposite the material;
    applying a negative pressure to an area between the material and the imprinting microtools to cause the floating pistons, along with the imprinting microtools, to slide within the imprinting chamber, causing the imprinting microtools to contact and apply pressure to the material;
    curing the imprinted material; and
    continuing to apply a negative pressure while heating the material.

13. The method of claim 12 where the material includes a heat curing epoxy.

14. The method of claim 12 comprising supplying a pressure to a side of the top floating piston opposite the top imprinting microtool greater than the negative pressure applied to the area between the material and the imprinting microtools.

15. A method of imprinting a pattern onto a material, comprising:
    positioning a first imprinting microtool between a floating piston within a rigid imprinting chamber and a material to be imprinted;
    positioning a second imprinting microtool adjacent to the material to be imprinted and on an opposite side than the first imprinting microtool;
    imprinting the material with the first imprinting microtool by decreasing air pressure in an area between the material and the first imprinting microtool to cause the floating piston, along with the first imprinting microtool, to slide within the imprinting chamber towards the material, causing the first imprinting microtool to contact and apply pressure to the material.

16. The method of claim 15 where positioning a first imprinting microtool includes positioning the first imprinting microtool adjacent to a substrate for use in mounting integrated circuit chips and dies in a semiconductor package.

17. The method of claim 15 where imprinting the material includes imprinting paths for conductive traces and holes.

* * * * *